(12) United States Patent
Garza, Jr. et al.

(10) Patent No.: US 9,055,677 B2
(45) Date of Patent: Jun. 9, 2015

(54) CABLE PASS-THROUGH PANEL FOR ELECTRONIC EQUIPMENT ENCLOSURE

(71) Applicant: CHATSWORTH PRODUCTS, INC., Westlake Village, CA (US)

(72) Inventors: Jose Arturo Garza, Jr., Pflugerville, TX (US); Richard Evans Lewis, II, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 14/157,349

(22) Filed: Jan. 16, 2014

(65) Prior Publication Data

US 2014/0132134 A1 May 15, 2014

Related U.S. Application Data

(62) Division of application No. 13/229,705, filed on Sep. 10, 2011, now abandoned.

(60) Provisional application No. 61/381,905, filed on Sep. 10, 2010.

(51) Int. Cl.
*A47G 29/00* (2006.01)
*A47B 81/00* (2006.01)
*H05K 5/02* (2006.01)

(52) U.S. Cl.
CPC ............ *H05K 5/0247* (2013.01); *H05K 5/0213* (2013.01)

(58) Field of Classification Search
CPC ........... F16B 12/38; G06F 1/181; H05K 7/18; H05K 7/186
USPC .......... 312/265.1, 265.2, 265.3, 265.4, 223.1, 312/213, 223.6, 265.5
See application file for complete search history.

(56) References Cited

U.S. PATENT DOCUMENTS

| | | |
|---|---|---|
| 1,129,040 A | 2/1915 | McClure |
| 1,919,166 A | 7/1933 | Lavarack |
| 2,039,886 A | 5/1936 | Cohn |
| 2,424,217 A | 7/1947 | Bales |
| 2,459,953 A | 1/1949 | Mills |
| 2,616,142 A | 11/1952 | Tinnerman |
| 2,667,368 A | 1/1954 | Ferguson |
| 2,756,369 A | 7/1956 | Gorrie |
| 2,880,379 A | 3/1959 | Stoddart et al. |
| 2,999,190 A | 9/1961 | Armandroff et al. |
| 3,034,844 A | 5/1962 | Anderson et al. |
| 3,143,195 A | 8/1964 | Schroeder |
| 3,192,306 A | 6/1965 | Skonnord |
| 3,265,419 A | 8/1966 | Durnbaugh et al. |
| 3,404,931 A | 10/1968 | Fall et al. |
| 3,563,627 A | 2/1971 | Whipps |
| 3,585,333 A | 6/1971 | Valle et al. |
| 3,655,254 A | 4/1972 | Mayer et al. |
| 3,675,955 A | 7/1972 | Hajduk |
| 4,040,694 A | 8/1977 | Lascarrou |
| 4,101,233 A | 7/1978 | McConnell |
| 4,148,453 A | 4/1979 | Brantly |
| 4,495,234 A | 1/1985 | Tominaga et al. |
| 4,497,411 A | 2/1985 | DeBortoli |
| 4,551,577 A | 11/1985 | Byrne |
| 4,553,674 A | 11/1985 | Yoshikawa et al. |
| 4,592,602 A | 6/1986 | Kuster et al. |
| 4,643,319 A | 2/1987 | Debus et al. |
| 4,715,502 A | 12/1987 | Salmon |
| 4,814,942 A | 3/1989 | Robirds et al. |
| 4,825,339 A | 4/1989 | Boudon |
| 4,869,380 A | 9/1989 | Metcalfe et al. |
| 4,941,717 A | 7/1990 | Beaulieu |
| 4,944,082 A | 7/1990 | Jones et al. |
| 4,962,443 A | 10/1990 | Cole |
| 4,964,020 A | 10/1990 | Savage et al. |
| 4,988,008 A | 1/1991 | Blum et al. |
| 5,004,107 A | 4/1991 | Sevier et al. |
| 5,009,383 A | 4/1991 | Chapman |
| 5,020,866 A | 6/1991 | McIlwraith |
| 5,052,565 A | 10/1991 | Zachrei |
| 5,149,026 A | 9/1992 | Allen |
| 5,165,770 A | 11/1992 | Hahn |
| 5,250,752 A | 10/1993 | Cutright |

(Continued)

FOREIGN PATENT DOCUMENTS

| | | |
|---|---|---|
| AU | 2008254682 | 11/2012 |
| CN | 102177633 A | 9/2011 |
| DE | 7836374 | 3/1979 |
| DE | 19615759 A1 | 10/1997 |
| DE | 20207426 U1 | 9/2002 |
| EC | 000663943-0001 | 7/2007 |
| EC | 000663943-0002 | 7/2007 |
| EC | 000663943-0003 | 7/2007 |
| EC | 000663943-0004 | 7/2007 |
| EP | 0577433 | 1/1994 |

(Continued)

OTHER PUBLICATIONS

Informatin Disclosure Statement (IDS) Letter Regarding Common Patent Application(s), dated Apr. 1, 2014.
Chatsworth Products, Inc., "Thermal Management Solutions", Signature Solutions Brochure, Revision dated Mar. 2008, www.chatsworth.com/passivecooling (6 pages).

(Continued)

*Primary Examiner* — Daniel Rohrhoff
*Assistant Examiner* — Kimberley S Wright
(74) *Attorney, Agent, or Firm* — Tillman Wright, PLLC; James D. Wright; David R. Higgins

(57) ABSTRACT

An electronic equipment enclosure includes a frame structure and at least one panel secured to the frame structure. The at least one panel includes one or more panel knockouts arranged therein. Each panel knockout is configured to be removable from the at least one panel to provide a pass-through opening for a cable. The at least one panel further includes a split brush assembly seated in place of a removed one of the one or more panel knockouts.

12 Claims, 11 Drawing Sheets

(56) References Cited

U.S. PATENT DOCUMENTS

| | | |
|---|---|---|
| 5,263,252 A | 11/1993 | Bruggink |
| 5,275,296 A | 1/1994 | Zachrai |
| 5,284,254 A | 2/1994 | Rinderer |
| 5,294,748 A | 3/1994 | Schwenk et al. |
| 5,310,255 A | 5/1994 | Ranallo |
| 5,323,916 A | 6/1994 | Salmon |
| 5,333,950 A | 8/1994 | Zachrai |
| 5,372,262 A | 12/1994 | Benson et al. |
| 5,380,083 A | 1/1995 | Jones et al. |
| 5,380,803 A | 1/1995 | Coutant et al. |
| 5,460,441 A | 10/1995 | Hastings et al. |
| 5,488,543 A | 1/1996 | Mazura et al. |
| 5,497,444 A | 3/1996 | Wheeler |
| 5,498,073 A | 3/1996 | Charbonneau et al. |
| 5,536,079 A | 7/1996 | Kostic |
| 5,540,339 A | 7/1996 | Lerman |
| 5,542,549 A | 8/1996 | Siemon et al. |
| 5,566,836 A | 10/1996 | Lerman |
| 5,586,012 A | 12/1996 | Lerman |
| 5,639,150 A | 6/1997 | Anderson et al. |
| 5,640,482 A | 6/1997 | Barry et al. |
| 5,695,263 A | 12/1997 | Simon et al. |
| 5,713,651 A | 2/1998 | Essig et al. |
| 5,728,973 A | 3/1998 | Jorgensen |
| 5,758,002 A | 5/1998 | Walters |
| 5,791,498 A | 8/1998 | Mills |
| 5,798,485 A | 8/1998 | Rohde et al. |
| 5,806,945 A | 9/1998 | Anderson et al. |
| 5,806,946 A | 9/1998 | Benner et al. |
| 5,819,956 A | 10/1998 | Rinderer |
| 5,933,563 A | 8/1999 | Schaffer et al. |
| 5,938,302 A | 8/1999 | Anderson et al. |
| 5,954,525 A | 9/1999 | Siegal et al. |
| 5,961,081 A | 10/1999 | Rinderer |
| 5,975,315 A | 11/1999 | Jordan |
| 5,992,808 A | 11/1999 | Morrow |
| 5,997,117 A | 12/1999 | Krietzman |
| 6,008,621 A | 12/1999 | Madison et al. |
| 6,011,221 A | 1/2000 | Lecinski et al. |
| 6,019,446 A | 2/2000 | Laboch et al. |
| 6,036,290 A | 3/2000 | Jancsek et al. |
| 6,039,420 A | 3/2000 | Besserer et al. |
| 6,044,193 A | 3/2000 | Szentesi et al. |
| 6,047,838 A | 4/2000 | Rindoks et al. |
| 6,065,612 A | 5/2000 | Rinderer |
| 6,067,233 A | 5/2000 | English et al. |
| 6,095,345 A | 8/2000 | Gibbons |
| 6,103,973 A | 8/2000 | Sharp |
| 6,118,073 A | 9/2000 | Lau et al. |
| 6,123,203 A | 9/2000 | Gibbons |
| 6,123,400 A | 9/2000 | Nicolai et al. |
| 6,135,583 A | 10/2000 | Simon et al. |
| 6,155,658 A | 12/2000 | Woodward et al. |
| 6,179,398 B1 | 1/2001 | Martin |
| 6,181,549 B1 | 1/2001 | Mills et al. |
| 6,185,098 B1 | 2/2001 | Benavides |
| 6,201,919 B1 | 3/2001 | Puetz et al. |
| D440,210 S | 4/2001 | Larsen et al. |
| 6,223,908 B1 | 5/2001 | Kurtsman |
| 6,231,142 B1 | 5/2001 | Pochet |
| 6,238,029 B1 | 5/2001 | Marzec et al. |
| 6,245,998 B1 | 6/2001 | Curry et al. |
| 6,254,207 B1 | 7/2001 | Leneutre |
| 6,282,854 B1 | 9/2001 | Vos et al. |
| 6,293,637 B1 | 9/2001 | Anderson et al. |
| 6,299,268 B1 | 10/2001 | Carle et al. |
| 6,313,405 B1 | 11/2001 | Rinderer |
| 6,315,132 B1 | 11/2001 | Hartel et al. |
| 6,321,917 B1 | 11/2001 | Mendoza |
| 6,327,150 B1 | 12/2001 | Levy et al. |
| 6,340,141 B1 | 1/2002 | Rinderer |
| 6,347,714 B1 | 2/2002 | Fournier et al. |
| 6,349,837 B1 | 2/2002 | Serban |
| 6,401,940 B1 | 6/2002 | Hartel et al. |
| 6,410,844 B1 | 6/2002 | Bruner et al. |
| 6,422,399 B1 | 7/2002 | Castillo et al. |
| 6,425,488 B1 | 7/2002 | Notohardjono et al. |
| 6,425,648 B1 | 7/2002 | Notohardjono et al. |
| 6,481,582 B1 | 11/2002 | Rinderer |
| 6,489,565 B1 | 12/2002 | Krietzman et al. |
| 6,502,702 B1 | 1/2003 | Hsue et al. |
| 6,504,100 B1 | 1/2003 | Lawrence et al. |
| 6,510,589 B2 | 1/2003 | Schrage |
| 6,513,770 B1 | 2/2003 | Franz et al. |
| 6,517,174 B2 | 2/2003 | Sevier |
| 6,527,351 B1 | 3/2003 | Sevier et al. |
| 6,541,705 B1 | 4/2003 | McGrath |
| 6,554,697 B1 | 4/2003 | Koplin |
| 6,561,602 B1 | 5/2003 | Sevier et al. |
| 6,565,166 B1 | 5/2003 | Bulk et al. |
| 6,570,754 B2 | 5/2003 | Foley et al. |
| 6,601,932 B1 | 8/2003 | Helgenberg et al. |
| 6,605,777 B1 | 8/2003 | Anderson et al. |
| 6,605,782 B1 | 8/2003 | Krietzman et al. |
| 6,629,505 B1 | 10/2003 | Cronk et al. |
| 6,632,999 B2 | 10/2003 | Sempliner et al. |
| 6,655,534 B2 | 12/2003 | Williams et al. |
| 6,695,149 B1 | 2/2004 | Cote et al. |
| 6,760,531 B1 | 7/2004 | Solheid et al. |
| 6,769,551 B2 | 8/2004 | Rafferty et al. |
| 6,785,459 B2 | 8/2004 | Schmidt et al. |
| 6,788,535 B2 | 9/2004 | Dodgen et al. |
| 6,791,841 B1 | 9/2004 | Tirrell et al. |
| 6,796,437 B2 | 9/2004 | Krampotich et al. |
| 6,796,438 B2 | 9/2004 | Mendoza |
| 6,796,623 B1 | 9/2004 | Fontana et al. |
| 6,808,240 B2 | 10/2004 | Altena |
| 6,814,417 B2 | 11/2004 | Hartel et al. |
| 6,866,154 B2 | 3/2005 | Hartman et al. |
| 6,884,942 B2 | 4/2005 | McGrath et al. |
| 6,902,069 B2 | 6/2005 | Hartman et al. |
| 6,920,038 B2 | 7/2005 | Gehlbach |
| 6,930,886 B2 | 8/2005 | Velez et al. |
| 6,945,616 B2 | 9/2005 | Webster et al. |
| 6,992,247 B2 | 1/2006 | Rasmussen et al. |
| 7,000,784 B2 | 2/2006 | Canty et al. |
| 7,086,707 B2 | 8/2006 | Wyatt et al. |
| 7,093,725 B2 | 8/2006 | Hartman et al. |
| 7,141,891 B2 | 11/2006 | McNally et al. |
| 7,144,320 B2 | 12/2006 | Turek et al. |
| 7,168,576 B2 | 1/2007 | Williams |
| 7,178,679 B2 | 2/2007 | Canty et al. |
| 7,188,735 B2 | 3/2007 | Nakagawa et al. |
| 7,204,371 B2 | 4/2007 | Woolsey et al. |
| 7,255,409 B2 | 8/2007 | Hu et al. |
| 7,255,640 B2 | 8/2007 | Aldag et al. |
| 7,285,027 B2 | 10/2007 | McGrath et al. |
| 7,293,666 B2 | 11/2007 | Mattlin et al. |
| 7,312,980 B2 | 12/2007 | Ewing et al. |
| 7,316,461 B2 | 1/2008 | Wyatt et al. |
| 7,355,115 B2 | 4/2008 | Liang |
| 7,362,941 B2 | 4/2008 | Rinderer et al. |
| 7,364,243 B2 | 4/2008 | Wyatt et al. |
| 7,378,046 B2 | 5/2008 | Canty et al. |
| 7,406,242 B1 | 7/2008 | Braga |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| D584,251 S | 1/2009 | Lewis, II et al. |
| D584,252 S | 1/2009 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| D588,081 S | 3/2009 | Lewis, II et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| D592,618 S | 5/2009 | Lewis, II et al. |
| 7,542,287 B2 | 6/2009 | Lewis, II et al. |
| D596,928 S | 7/2009 | Lawrence et al. |
| 7,592,541 B2 | 9/2009 | Adducci et al. |
| 7,608,779 B2 | 10/2009 | Adducci et al. |

(56) References Cited

U.S. PATENT DOCUMENTS

| | | |
|---|---|---|
| 7,637,771 B2 | 12/2009 | Laursen |
| 7,643,291 B2 | 1/2010 | Mallia et al. |
| 7,667,135 B2 | 2/2010 | Adducci et al. |
| D611,326 S | 3/2010 | Alaniz et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,719,835 B1 | 5/2010 | Schluter |
| 7,746,637 B2 | 6/2010 | Donowho et al. |
| 7,772,489 B2 | 8/2010 | Adducci et al. |
| 7,778,513 B2 | 8/2010 | Rinderer et al. |
| 7,781,675 B2 | 8/2010 | Adducci et al. |
| 7,795,532 B2 | 9/2010 | Walker |
| 7,804,685 B2 | 9/2010 | Krietzman |
| 7,815,246 B2 | 10/2010 | Nakamura et al. |
| 7,839,635 B2 | 11/2010 | Donowho et al. |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,939,763 B2 | 5/2011 | Jones et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,974,105 B2 | 7/2011 | Dean, Jr. et al. |
| 7,999,183 B2 | 8/2011 | Garza et al. |
| 8,003,890 B2 | 8/2011 | Donowho et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,087,979 B2 | 1/2012 | Rasmussen |
| 8,107,238 B2 | 1/2012 | Krietzman et al. |
| 8,138,419 B2 | 3/2012 | Garza et al. |
| 8,237,052 B2 | 8/2012 | Adducci et al. |
| 8,281,940 B2 | 10/2012 | Fan |
| 8,330,043 B2 | 12/2012 | Alaniz et al. |
| 8,395,046 B2 | 3/2013 | Nicewicz et al. |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,437,147 B2 | 5/2013 | Dean, Jr. et al. |
| 8,443,987 B2 | 5/2013 | Peng et al. |
| 8,459,756 B2 | 6/2013 | Linhares et al. |
| 8,653,363 B2 | 2/2014 | Behrens et al. |
| 8,730,665 B2 | 5/2014 | Lewis, II et al. |
| 8,787,023 B2 | 7/2014 | Lewis, II et al. |
| 8,901,438 B2 | 12/2014 | Lewis, II et al. |
| 2001/0015598 A1 | 8/2001 | Sevier |
| 2002/0046979 A1 | 4/2002 | Larsen et al. |
| 2002/0074149 A1 | 6/2002 | Lawrence et al. |
| 2002/0197045 A1 | 12/2002 | Schmidt et al. |
| 2003/0037953 A1 | 2/2003 | Sarkinen et al. |
| 2003/0079897 A1 | 5/2003 | Sempliner et al. |
| 2003/0118311 A1 | 6/2003 | Thibault et al. |
| 2004/0007372 A1 | 1/2004 | Krietzman et al. |
| 2004/0016708 A1 | 1/2004 | Rafferty et al. |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0069725 A1 | 4/2004 | Adducci et al. |
| 2004/0146266 A1 | 7/2004 | Solheid et al. |
| 2004/0173545 A1 | 9/2004 | Canty et al. |
| 2004/0183409 A1 | 9/2004 | Rinderer |
| 2004/0190270 A1 | 9/2004 | Aldag et al. |
| 2004/0201335 A1 | 10/2004 | Davis |
| 2004/0226900 A1 | 11/2004 | Canty et al. |
| 2004/0231875 A1 | 11/2004 | Rasmussen et al. |
| 2005/0221683 A1 | 10/2005 | McGrath et al. |
| 2005/0247650 A1 | 11/2005 | Vogel et al. |
| 2006/0043031 A1 | 3/2006 | Rinderer |
| 2006/0087792 A1 | 4/2006 | Ng et al. |
| 2006/0103270 A1 | 5/2006 | Bergesch et al. |
| 2006/0118321 A1 | 6/2006 | Herring et al. |
| 2006/0141921 A1 | 6/2006 | Turek et al. |
| 2006/0162948 A1 | 7/2006 | Rinderer et al. |
| 2006/0213853 A1 | 9/2006 | Schluter et al. |
| 2007/0064389 A1 | 3/2007 | Lewis, II et al. |
| 2007/0064391 A1 | 3/2007 | Lewis, II et al. |
| 2007/0081874 A1 | 4/2007 | Kamino et al. |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0130262 A1 | 6/2008 | Rinderer et al. |
| 2008/0174217 A1 | 7/2008 | Walker |
| 2008/0180004 A1 | 7/2008 | Martich et al. |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0151983 A1 | 6/2009 | Sempliner et al. |
| 2009/0168306 A1 | 7/2009 | Sharp et al. |
| 2009/0190307 A1 | 7/2009 | Krietzman |
| 2009/0224110 A1 | 9/2009 | Donowho et al. |
| 2009/0227197 A1 | 9/2009 | Lewis, II et al. |
| 2009/0236117 A1 | 9/2009 | Garza et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2009/0283488 A1 | 11/2009 | McMillan, III et al. |
| 2010/0051308 A1 | 3/2010 | Hansen et al. |
| 2010/0061059 A1 | 3/2010 | Krietzman et al. |
| 2010/0084188 A1 | 4/2010 | Rajvanshi et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0056895 A1 | 3/2011 | Tichy |
| 2011/0083873 A1 | 4/2011 | Hartman et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0278060 A1 | 11/2011 | Rajvanshi et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0181906 A1 | 7/2012 | Caveney |
| 2012/0267991 A1 | 10/2012 | Adducci et al. |
| 2012/0305307 A1 | 12/2012 | Korcz et al. |

(56) References Cited

U.S. PATENT DOCUMENTS

| | | |
|---|---|---|
| 2013/0160271 A1 | 6/2013 | Krietzman et al. |
| 2013/0165035 A1 | 6/2013 | Krietzman et al. |

FOREIGN PATENT DOCUMENTS

| | | | |
|---|---|---|---|
| EP | 2205054 | A1 | 7/2010 |
| EP | 2429271 | | 3/2012 |
| EP | 2429272 | | 3/2012 |
| GB | 2366084 | B | 9/2002 |
| GB | 2468823 | B | 10/2012 |
| SE | 535066 | C2 | 4/2012 |
| WO | 0101533 | A1 | 1/2001 |
| WO | 2006055506 | A2 | 5/2006 |
| WO | 2008022058 | A2 | 2/2008 |
| WO | 2008022058 | A3 | 11/2008 |
| WO | 2008144678 | A1 | 11/2008 |
| WO | 2009089008 | A2 | 7/2009 |
| WO | 2009089307 | A2 | 7/2009 |
| WO | 2009103090 | A2 | 8/2009 |
| WO | 2009103090 | A3 | 10/2009 |
| WO | 2009143193 | A2 | 11/2009 |
| WO | 2009089307 | A3 | 12/2009 |
| WO | 2009143193 | A3 | 3/2010 |
| WO | 2010028384 | A2 | 3/2010 |
| WO | 2010028384 | A3 | 5/2010 |
| WO | 2010117699 | A1 | 10/2010 |
| WO | 2011088430 | A2 | 7/2011 |
| WO | 2011088438 | | 7/2011 |

OTHER PUBLICATIONS

HP 10000 G2 42U Rack Air Duct Installation Guide, Hewlett-Packard Development Company, LP, dated Aug. 2008 (23 pages).

Panduit Net-Access Vertical Exhaust System (VES) Specification Sheet, Panduit Corporation, dated Feb. 2011 (4 pages).

Panduit Net-Access Vertical Exhaust Duct (VED) Instructions, Panduit Corporation, dated 2009 (4 pages).

Chatsworth Products, Inc. "Cabinet Airflow Baffles—Air Dam Kit for CPI Cabinet Systems", Product Data Sheet, Jun. 2004, techsupport@chatsworth.com (2 pages).

Informatin Disclosure Stattement (IDS) Letter Regarding Common Patent Application(s), dated Oct. 9, 2014.

"European Search Report" (partial), European Patent Application No. 11275109.4, dated Sep. 18, 2014 (5 pages).

CABLE PASS-THROUGH PANEL FOR ELECTRONIC EQUIPMENT ENCLOSURE

CROSS-REFERENCE TO RELATED APPLICATION

The present application is a divisional patent application of, and claims priority under 35 U.S.C. §120 to, U.S. nonprovisional patent application Ser. No. 13/229,705, filed Sep. 10, 2011, which nonprovisional patent application published Mar. 15, 2012 as U.S. patent application publication no. US 2012/0062086 A1, which patent application and publication are incorporated by reference herein in their entirety, and which patent application is a U.S. non-provisional patent application of, and claims priority under 35 U.S.C. §119(e) to, U.S. provisional patent application Ser. No. 61/381,905, filed Sep. 10, 2010, which '905 application is likewise incorporated by reference herein in its entirety. Additionally, each of the following U.S. patent applications, and any application publication thereof, is expressly incorporated by reference herein in its entirety:

(a) U.S. provisional patent application Ser. No. 61/381,904, filed Sep. 10, 2010, and entitled, "ELECTRONIC EQUIPMENT CABINET STRUCTURE;"
(b) U.S. provisional patent application Ser. No. 61/381,909, filed Sep. 10, 2010, and entitled, "RAIL SEAL FOR ELECTRONIC EQUIPMENT ENCLOSURE;"
(c) U.S. provisional patent application Ser. No. 61/381,912, filed Sep. 10, 2010, and entitled, "RAIL MOUNTING CLAMP FOR ELECTRONIC EQUIPMENT ENCLOSURE;"
(d) U.S. provisional patent application Ser. No. 61/381,918, filed Sep. 10, 2010, and entitled, "VERTICAL MOUNTING RAIL WITH CABLE MANAGEMENT FEATURES,"
(e) U.S. non-provisional patent application Ser. No. 13/229,704, filed Sep. 10, 2011, published on Mar. 15, 2012 as U.S. Patent Application Publication No. US 2012/0062084 A1, entitled, "ELECTRONIC EQUIPMENT CABINET STRUCTURE," and issued on Dec. 2, 2014 as U.S. Pat. No. 8,901,438;
(f) U.S. non-provisional patent application Ser. No. 13/229,706, filed Sep. 10, 2011, published on Mar. 15, 2012 as U.S. Patent Application Publication No. US 2012/0063099 A1, entitled, "RAIL SEAL FOR ELECTRONIC EQUIPMENT ENCLOSURE;"
(g) U.S. non-provisional patent application Ser. No. 13/229,707, filed Sep. 10, 2011, published on Mar. 15, 2012 as U.S. Patent Application Publication No. US 2012/0062083 A1, entitled, "RAIL MOUNTING CLAMP FOR ELECTRONIC EQUIPMENT ENCLOSURE," and issued on Jul. 22, 2014 as U.S. Pat. No. 8,787,023; and
(h) U.S. non-provisional patent application Ser. No. 13/229,708, filed Sep. 10, 2011, published on Mar. 15, 2012 as U.S. Patent Application Publication No. US 2012/0062091 A1, and entitled, "VERTICAL MOUNTING RAIL WITH CABLE MANAGEMENT FEATURES."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to electronic equipment cabinet structures and enclosures, and, in particular, to top panel for providing cable pass-through in electronic equipment cabinet structures and enclosures.

2. Background

Equipment enclosures, such as frames, cabinets and the like for supporting computer and other electronic equipment, are very well known. Such equipment enclosures are often partially or fully enclosed, either directly through the use of doors and panels mounted directly thereon. The panel situated at the top of the equipment enclosure is often removed or modified in some manner to accommodate changes in the type or quantity of cables passing into or out of the enclosure.

In many known equipment enclosures, the top panel is installed on the equipment enclosure with the aid of tools. A typical installation process involves the use of a drill or similar tools to secure screws or other fasteners in at least the top four corners of the enclosure frame. In other cases, the top panel fits loosely atop the equipment enclosure and is secured with "push pins" placed to extend through openings in the top panel and engage with the top of the equipment enclosure. A risk associated with such a construction may arise if an installer forgets to engage or otherwise implement such push pins, thereby leaving the enclosure in a condition where the top panel may become inadvertently detached from the enclosure, such as by moving the enclosure. In still other cases, the top panel is permanently affixed to the top of the equipment enclosure through a welding process. As such, a need exists for improvement in the top panel installation process such that a top panel can be installed in an equipment enclosure in a non-permanent manner without the need for tools.

In order to accommodate larger connectors passing through the top panel of known equipment enclosures, portions of the top panel are often physically deformed during the installation process, which can often lead to undesirable results by damaging the integrity of the panel material. As an example, secondary operations—such as the removal of metal material from the top panel—may be necessary to accommodate such larger connectors in known equipment enclosures. As such, a need exists for improvement in top panel construction and design such that the top panel can readily accommodate pass-through of larger connectors without damaging or otherwise affecting the integrity of the top panel.

Accordingly, a need exists for improvement in top panel construction and installation for electronic equipment enclosures. These, and other needs, are addressed by one or more aspects of the present invention.

SUMMARY OF THE PRESENT INVENTION

The present invention includes many aspects and features. Moreover, while many aspects and features relate to, and are described in, the context of enclosures for electronic equipment, the present invention is not limited to use only in enclosures for electronic equipment, as will become apparent from the following summaries and detailed descriptions of aspects, features, and one or more embodiments of the present invention.

Broadly defined, the present invention according to a first aspect includes an electronic equipment enclosure having a frame structure and a top panel tool-lessly secured to an upper portion of the frame structure.

In features of this aspect, the top panel may include one or more panel knockouts configured to be removable from the top panel to provide a pass-through opening for a cable; the one or more panel knockouts may include curved lateral edges; and the one or more panel knockouts may be laser-cut into the top panel.

In further features of this aspect, the top panel may include one or more panel sub-knockouts configured to be removable from the top panel to provide a pass-through opening for a cable; and the one or more panel sub-knockouts may be laser-cut into the top panel.

In still further features of this aspect, the top panel may further include a split brush assembly seated in place of one of the one or more panel knockouts; and the split brush assembly may be snap-fit to the top panel.

In still further features of this aspect, the top panel may include one or more stiffening flanges at an underside thereof; one of the one or more stiffening flanges may include at least one spring pin opening therethrough that corresponds with a spring pin mounted to the frame structure; and a portion of the spring pin may extend through the spring pin opening to tool-lessly secure the top panel to the frame structure.

In still further features of this aspect, the top panel may be securable to the frame structure in either of a front-to-rear orientation or a rear-to-front orientation; and the top panel may include an offset edge at an end thereof for positioning underneath an upper cross member of the frame structure.

Broadly defined, the present invention according to a second aspect includes an electronic equipment enclosure substantially as shown and described.

Broadly defined, the present invention according to a third aspect includes a top panel for securement atop an electronic equipment enclosure. The top panel includes a generally flat sheet composed of a metal-based material and one or more panel knockouts configured to be removable from the top panel to provide a pass-through opening for a cable.

In features of this aspect, the one or more panel knockouts may include curved lateral edges; the one or more panel knockouts may be laser-cut; the top panel may further include one or more panel sub-knockouts configured to be removable from the top panel to provide a pass-through opening for a cable; and the one or more panel sub-knockouts may be laser-cut.

In further features of this aspect, the top panel may further include a split brush assembly seated in place of one of the one or more panel knockouts; and the split brush assembly may be attachable by snap fitting.

In still further features of this aspect, the top panel may further include one or more stiffening flanges at an underside thereof, at least one of which includes at least one spring pin opening; and the top panel may further include an offset edge at an end thereof.

Broadly defined, the present invention according to a fourth aspect includes a top panel for securement atop an electronic equipment enclosure substantially as shown and described.

Broadly defined, the present invention according to a fifth aspect includes a method for tool-lessly installing a top panel atop an electronic equipment enclosure. The method includes providing a top panel having an offset edge at an end thereof and a stiffening flange at an underside thereof with at least one spring pin opening extending therethrough; positioning the top panel relative to a frame structure of an electronic equipment enclosure such that the offset edge slides underneath an upper cross member of the frame structure; engaging the stiffening flange against one or more spring pins mounted to the frame structure to deflect the spring pins; and lowering the top panel onto the frame structure to permit the one or more spring pins to spring back and extend through the one or more spring pin openings of the stiffening flange.

In features of this aspect, the top panel may include one or more panel knockouts configured to be removable from the top panel to provide a pass-through opening for a cable; the one or more panel knockouts may be laser-cut into the top panel; the top panel may include one or more panel sub-knockouts configured to be removable from the top panel to provide a pass-through opening for a cable; the one or more panel sub-knockouts may be laser-cut into the top panel; and the method may further include removing one of the one or more panel knockouts from the top panel and attaching a split brush assembly to the top panel in place of the removed panel knockout.

In a further feature of this aspect, the method may further include unsecuring the top panel from the frame structure and resecuring the top panel in an opposite orientation.

Broadly defined, the present invention according to a sixth aspect includes a method for tool-lessly installing a top panel atop an electronic equipment enclosure substantially as shown and described.

In addition to the aforementioned aspects and features of the present invention, it should be noted that the present invention further encompasses the various possible combinations and subcombinations of such aspects and features. Thus, for example, any aspect may be combined with an aforementioned feature in accordance with the present invention without requiring any other aspect or feature.

Broadly defined, the present invention according to a seventh aspect includes a panel for securement to an electronic equipment enclosure. The panel includes a generally flat sheet composed of a metal-based material and one or more panel knockouts arranged in the generally flat sheet and each configured to be removable therefrom to provide a pass-through opening for a cable.

In features of this aspect, at least one of the one or more panel knockouts may include a central portion having curved lateral edges; at least one of the one or more panel knockouts may include a central portion having stair-stepped lateral edges; at least one of the one or more panel knockouts may include a central portion having chamfered lateral edges; at least one of the one or more panel knockouts includes a vent; and the one or more panel knockouts may be laser-cut.

In further features of this aspect, the panel may further include one or more panel sub-knockouts arranged in the generally flat sheet and configured to be removable therefrom to provide a pass-through opening for a cable; and the one or more panel sub-knockouts may be laser-cut.

In further features of this aspect, the panel may further include a split brush assembly seated in place of a removed one of the one or more panel knockouts; the split brush assembly may be seated by snap fitting to the generally flat sheet; the split brush assembly may include alignment pins inserted within apertures in the generally flat sheet; the split brush assembly may be attached to the generally flat sheet with fasteners; the split brush assembly may include at least two separate frame members, each separately attached to the generally flat sheet; and the split brush assembly may include a unitary structure attached to the generally flat sheet.

In still further features of this aspect, the panel may further include one or more stiffening flanges at an underside thereof, at least one of which includes at least one spring pin opening; the panel may further include an offset edge at an end thereof; the panel may be adapted for securement atop an electronic equipment enclosure; the panel may be adapted for securement to a side of an electronic equipment enclosure; and the panel may be adapted for securement to a bottom of an electronic equipment enclosure.

Broadly defined, the present invention according to an eighth aspect includes an electronic equipment enclosure that includes a frame structure and at least one panel secured to the frame structure. The at least one panel includes one or more panel knockouts arranged therein. Each panel knockout is configured to be removable from the at least one panel to provide a pass-through opening for a cable. The at least one panel further includes a split brush assembly seated in place of a removed one of the one or more panel knockouts.

In features of this aspect, at least one of the one or more panel knockouts may include a central portion having curved lateral edge; at least one of the one or more panel knockouts may include a central portion having stair-stepped lateral edges; at least one of the one or more panel knockouts may include a central portion having chamfered lateral edges; at least one of the one or more panel knockouts includes a vent; and the one or more panel knockouts may be laser-cut into the at least one panel.

In further features of this aspect, the at least one panel may further include one or more panel sub-knockouts arranged in the at least one panel and configured to be removable therefrom to provide a pass-through opening for a cable; and the one or more panel sub-knockouts may be laser-cut into the at least one panel.

In further features of this aspect, the split brush assembly may be seated by snap fitting to the at least one panel; the split brush assembly may include alignment pins inserted within apertures in the at least one panel; the split brush assembly may be attached to the at least one panel with fasteners; the split brush assembly may include at least a pair of frame members, each separately attached to the at least one panel; and the split brush assembly may include a unitary structure attached to the at least one panel.

In still further features of this aspect, the at least one panel may further include one or more stiffening flanges at an underside thereof, at least one of which includes at least one spring pin opening; the at least one panel may further include an offset edge at an end thereof; the at least one panel may include a top panel; the at least one panel may include a side panel; and the at least one panel may include a bottom panel.

Broadly defined, the present invention according to a ninth aspect includes an electronic equipment enclosure that includes a frame structure including at least one spring pin attached thereto, the at least one spring pin having an anchor end attached to the frame structure and a free flex end, and a panel having a flange at an interior-facing side thereof, the flange including at least one spring pin opening. The panel is adapted for tool-less securement to the frame structure by positioning of the at least one spring pin opening against the flex end of the at least one spring pin such that the flex end of the at least one spring pin extends through the at least one spring pin opening.

In features of this aspect, the panel may include one or more panel knockouts configured to be removable from the panel to provide a pass-through opening for a cable; at least one of the one or more panel knockouts may include a central portion having curved lateral edges; at least one of the one or more panel knockouts may include a central portion having stair-stepped lateral edges; at least one of the one or more panel knockouts may include a central portion having chamfered lateral edges; at least one of the one or more panel knockouts includes a vent; the one or more panel knockouts may be laser-cut into the panel; the panel may include one or more panel sub-knockouts configured to be removable from the panel to provide a pass-through opening for a cable; the one or more panel sub-knockouts may be laser-cut into the panel; the panel may further include a split brush assembly seated in place of a removed one of the one or more panel knockouts; the split brush assembly may be snap-fit to the panel; the split brush assembly may include alignment pins inserted within apertures in the panel; the split brush assembly may be attached to the panel with fasteners; the split brush assembly may include at least a pair of frame members, each separately attached to the panel; and the split brush assembly may include a unitary structure attached to the panel.

In further features of this aspect, the panel may be adapted for securement atop the electronic equipment enclosure; the panel may be adapted for securement to a side of the electronic equipment enclosure; the panel may be adapted for securement to a bottom of the electronic equipment enclosure; the panel may be securable to the frame structure in either of a front-to-rear orientation or a rear-to-front orientation; and the panel may include an offset edge at an end thereof for positioning underneath an upper cross member of the frame structure.

Broadly defined, the present invention according to a tenth aspect includes a method for installing a panel in an electronic equipment enclosure. The method includes providing a panel having an offset edge at an end thereof and a stiffening flange at an underside thereof with at least one spring pin opening extending therethrough; positioning the panel relative to a frame structure of an electronic equipment enclosure such that the offset edge slides underneath or inside a member of the frame structure; engaging the stiffening flange against one or more spring pins mounted to the frame structure, thereby deflecting the one or more spring pins; and maneuvering the panel onto the frame structure to permit the one or more spring pins to spring back and extend through the one or more spring pin openings of the stiffening flange.

In features of this aspect, the panel may include one or more panel knockouts configured to be removable from the panel to provide a pass-through opening for a cable; the one or more panel knockouts may be laser-cut into the panel; the panel may include one or more panel sub-knockouts configured to be removable from the panel to provide a pass-through opening for a cable; the one or more panel sub-knockouts may be laser-cut into the panel; the method may further include removing one of the one or more panel sub-knockouts from the panel; the method may further include replacing the removed panel sub-knockout with a vent; the method may further include removing one of the one or more panel knockouts from the panel; the method may further include replacing the removed panel knockout with a split brush assembly; replacing the removed panel knockout with a split brush assembly may include snap-fitting the split brush assembly to the panel; and replacing the removed panel knockout with a split brush assembly may include attaching the split brush assembly to the panel with fasteners.

In further features of this aspect, the method may further include reconfiguring the previously-installed panel by unsecuring the panel from the frame structure and resecuring the panel in an opposite orientation; the panel may be installed atop the electronic equipment enclosure; the panel may be installed at a side of the electronic equipment enclosure; and the panel may be installed at a bottom of the electronic equipment enclosure.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
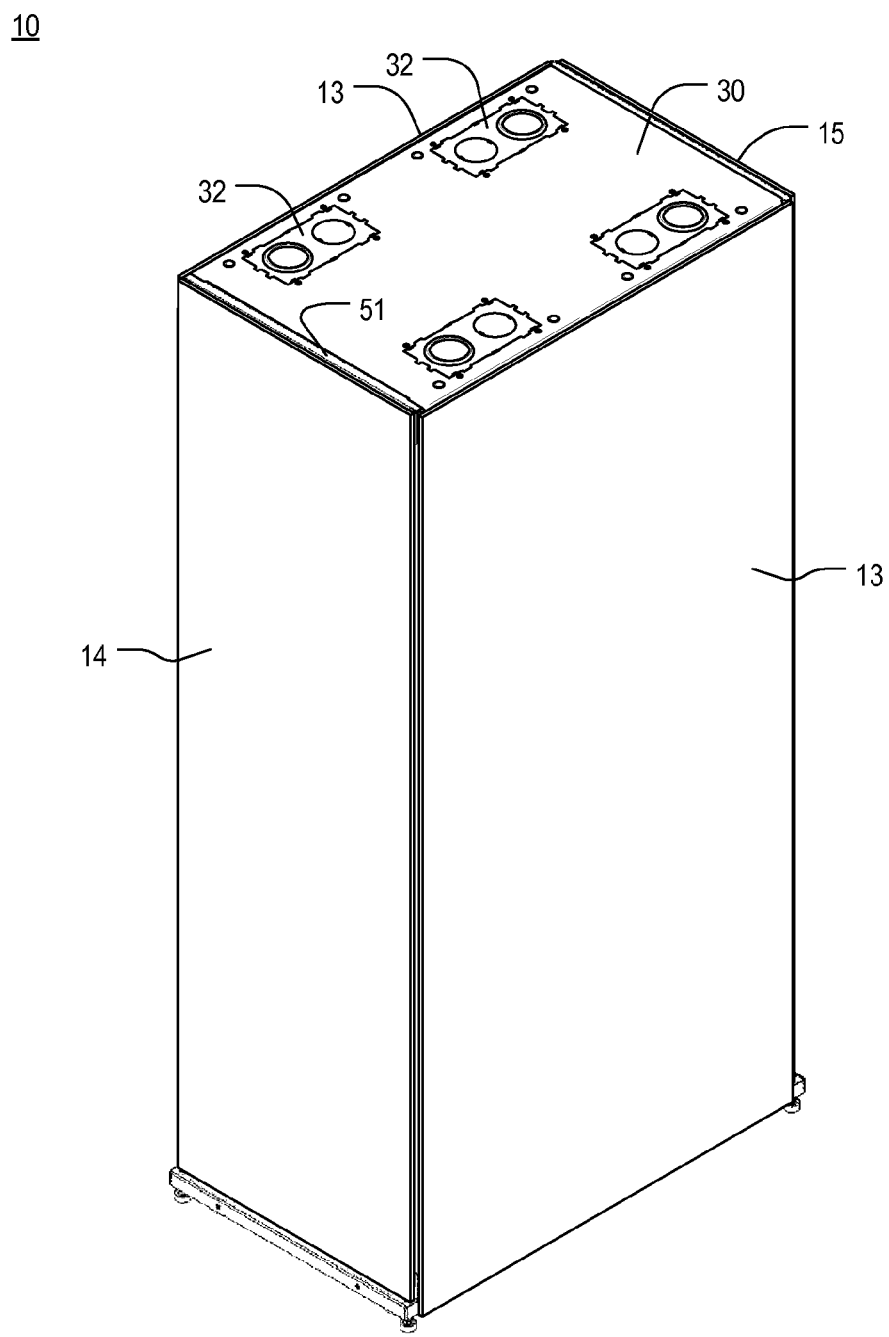
FIG. 1 is a front isometric view of an electronic equipment enclosure with a cable pass-through top panel installed thereon in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

Figure 2:
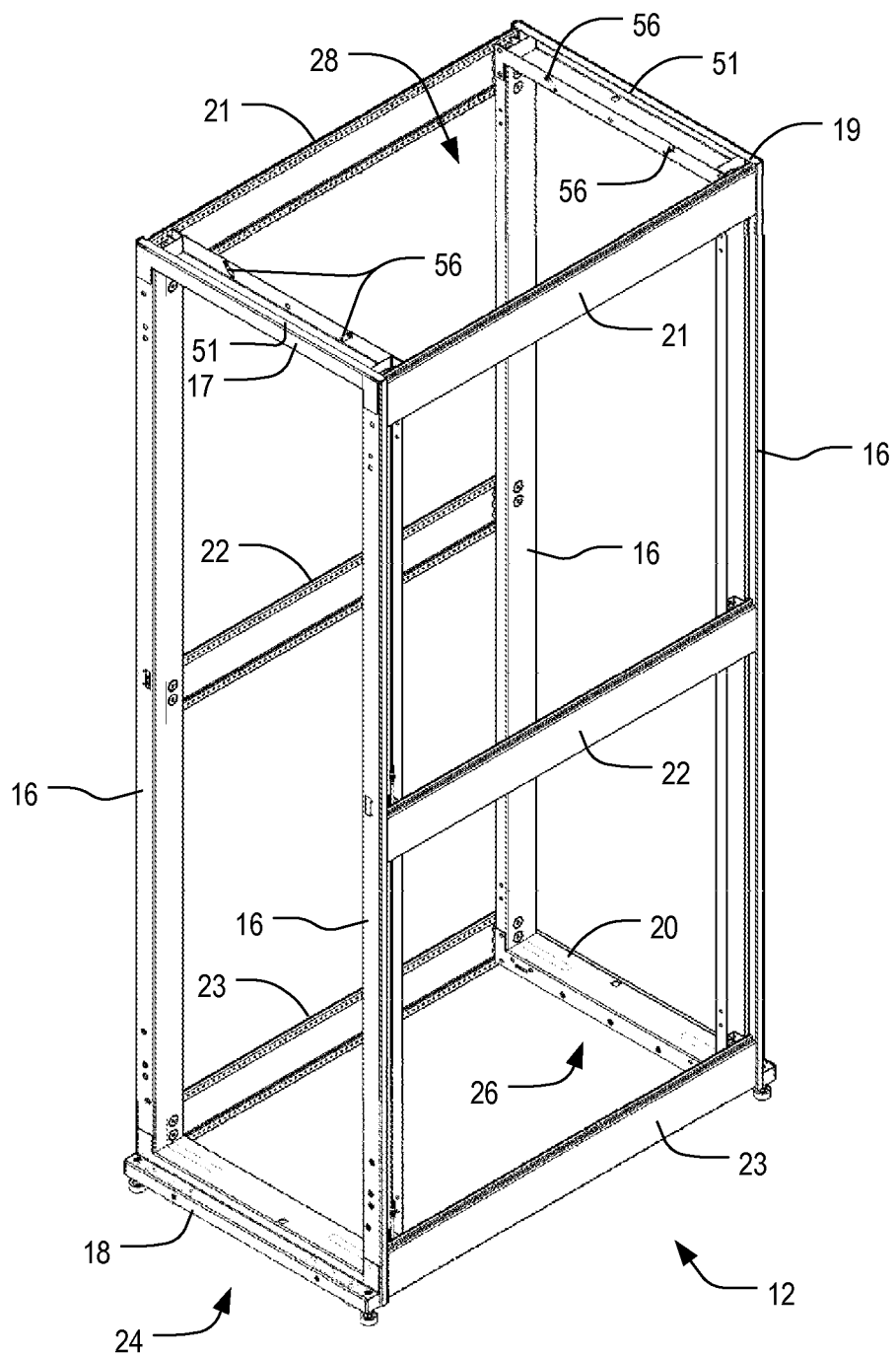
FIG. 2 is a front isometric view of a frame structure of the electronic equipment enclosure of FIG. 1 without the top panel installed thereon.

FIG. 1 is a front orthogonal view of an electronic equipment enclosure 10 with a top panel 30 thereon in accordance with one or more preferred embodiments of the present invention, and FIG. 2 is a front isometric view of a frame structure 12 of the electronic equipment enclosure 10 of FIG. 1 without the top panel 30 installed thereon. As perhaps best shown in FIG. 2, the frame structure 12 includes four vertical support posts 16, upper and lower front cross members 17,18, upper and lower rear cross members 19,20 and three pairs of side cross members 21,22,23. Each vertical support post 16 includes a plurality of cross member attachment apertures at each end. Two of the vertical support posts 16 are connected together at their upper and lower ends by the upper and lower front cross members 17,18, respectively, and the other two support posts 16 are connected together at their upper and lower ends by the upper and lower rear cross members 19,20, respectively. The front cross members 17,18 and their respective support posts 16 thus define a front frame 24, and the rear cross members 19,20 and their respective support posts 16 define a rear frame 26. The front and rear frames 24,26 may then be connected together at their respective corners by the upper, middle and lower side cross members 21,22,23.

Although the particular frame structure 12 described and illustrated herein may include various novel aspects, it will be apparent to the Ordinary Artisan that various aspects of the present invention are likewise applicable to frame structures of generally conventional design and construction. Furthermore, various different connection means may be used to join the various members together. One novel connection means is illustrated in FIGS. 1 and 2. However, although not illustrated herein, it will be apparent to the Ordinary Artisan that in at least some embodiments, any of a variety of other connection means may be used instead. In this regard, other examples of conventional connection means are described in commonly-assigned U.S. Pat. No. 6,185,098, U.S. Pat. No. 7,119,282, U.S. Pat. No. 7,697,285, U.S. Patent Application Publication No. US 2009/0190307 A1, U.S. Patent Application Publication No. US 2009/0227197 A1, U.S. Patent Application Publication No. US 2009/0283488 A1, and U.S. Patent Application Publication No. US 2010/0172092 A1, the entirety of each of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Still further, it will be evident to the Ordinary Artisan that in at least some embodiments, other structural arrangements may be used to form a frame structure on which panels may be mounted to form an enclosure. For example, in at least one embodiment (not illustrated), a frame structure may be formed from only two support posts.

Referring to FIG. 1, the enclosure 10 may include a plurality of panels, attached to the frame structure 12, which partially or fully enclose the enclosure 10. In contemplated embodiments, the enclosure 10 may include right and/or left panels 13, a front panel 14, and a rear panel 15, one or more of which may be configured to operate as a door to the interior of the enclosure 10 (not illustrated). The enclosure 10 may further include a bottom panel (not illustrated). Various different connection means may be used to join the various panels 13,14,15 to the frame structure 12. One or more novel connection means may be described and/or illustrated herein. However, although not illustrated herein, it will be apparent to the Ordinary Artisan that in at least some embodiments, any of a variety of other connection means may be used instead to join the panels to the frame structure 12.

The enclosure further includes a generally flat top panel 30 sized and shaped to fit an opening 28 defined by the four vertical support posts 16 in connection with the upper front cross member 17, the upper rear cross member 19, and the upper side cross members 21. When installed, the top panel 30 covers the opening 28. In a contemplated embodiment, the top panel 30 is manufactured from sheet metal or other metal-based material.

Figure 3:
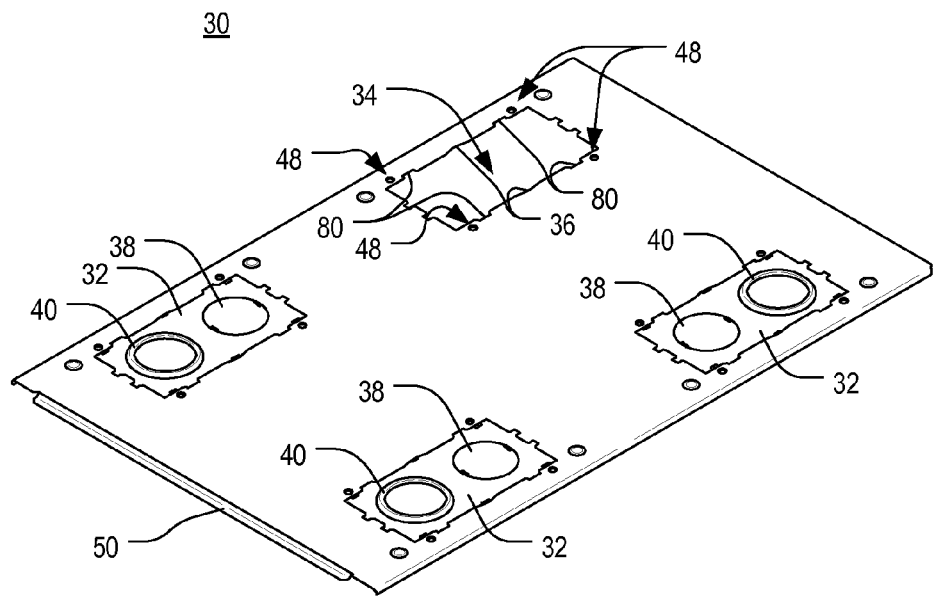
FIG. 3 is a top isometric view of the top panel of FIG. 1, shown with a panel knockout removed.
Figure 4:
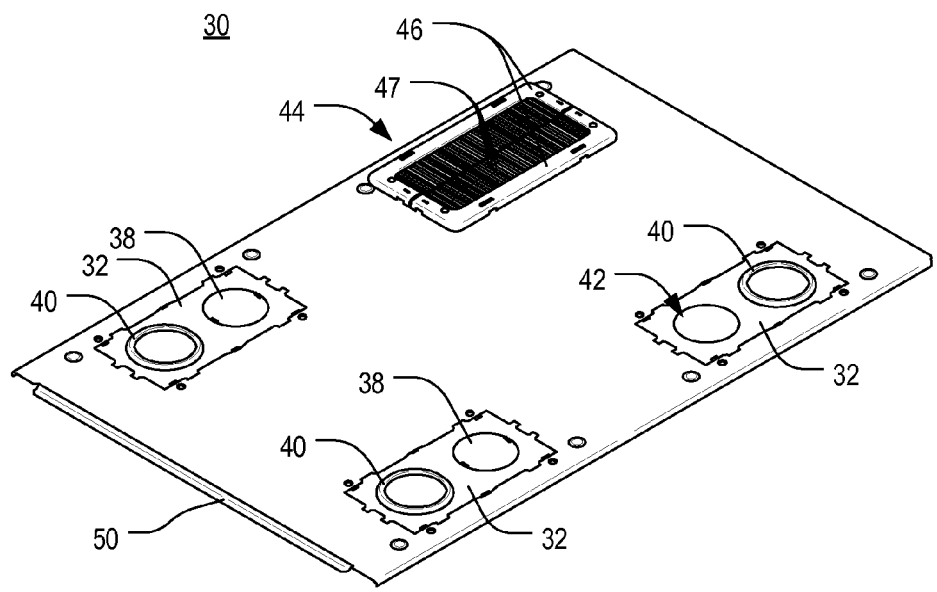
FIG. 4 is a top isometric view of the top panel of FIG. 1, shown with a panel knockout removed and replaced with a split brush assembly.

FIG. 3 is a top isometric view of the top panel 30 of FIG. 1, shown with a panel knockout 32 removed, and FIG. 4 is a top isometric view of the top panel 30 of FIG. 1, shown with a panel knockout 32 removed and replaced with a split brush assembly 44. As shown in FIG. 1, the top panel 30 includes one or more panel knockouts 32 arranged therein. As illustrated in FIG. 3, panel knockouts 32 are configured to be knocked out or removed from the top panel 30 to provide an opening 34 sized to permit pass-through of larger cables or higher quantities of cables. In particular, the panel knockouts 32 may be defined in the top panel 30 by a laser cutting process, thereby permitting removal by detaching or "punching" any of the panel knockouts 32 from the top panel 30. The central area of each opening 34 may have curved lateral edges 36 so as to accommodate large connectors such as a 60A PDU connector (not illustrated). Other shapes and configurations for the panel knockouts 32 and the resultant openings 34 are contemplated, as perhaps best shown in FIGS. 12A-12C. Panel knockouts 32 are spaced from the outer edge of the top panel 30 such that the large opening 34 in the top panel formed by the removal of the panel knockout 32 is arranged interiorly of the edges of the top panel 30.

As further shown in FIG. 3, each panel knockout 32 may itself include a panel sub-knockout 38 and/or a vent 40. In a manner similar to the panel knockout 32, the panel sub-knockout 38 is configured to be removed or knocked out from the panel knockout 32 to provide an opening 42 (shown on the right in FIG. 4) sized to permit pass-through of smaller cables or lesser quantities of cables. In one contemplated embodiment, the vent 40 may be installed in place of a removed one of the panel sub-knockouts 38. The panel sub-knockout 38 may be defined in the panel knockout 32 by a laser cutting process, thereby permitting removal by punching the panel sub-knockout 38 from the panel knockout 32. In a contemplated embodiment, the panel sub-knockouts 38 and vents 40 have a generally circular shape.

As can be appreciated by the Ordinary Artisan, the top panel 30 can be customized to accommodate different sizes and different quantities of cables and connectors passing therethrough. For smaller cables and lesser quantities of cables, the top panel 30 can be customized by knocking out one or more panel sub-knockouts 38, thereby providing smaller openings 42 to accommodate cables passing therethrough. Likewise, the top panel 30 can be customized to provide larger openings 34 by knocking out one or more panel knockouts 32 so as to accommodate larger cables or higher quantities of cables passing therethrough. In each situation, the top panel 30 can be customized in a manner such that no more of the top panel 30 is removed than is necessary to accommodate the desired size or quantity of cables or connectors. Furthermore, because the panel knockouts 32 and panel sub-knockouts 38 are laser-cut into the top panel 30, they can be removed from the top panel 30 with relative ease during an installation process without the aid of tools. In a contemplated embodiment, the top panel 30 has eight potential panel sub-knockouts 38 for low cable capacity and four panel knockouts 32 for high cable capacity.

As shown in FIG. 4, the top panel 30 may be customized further by replacing one or more panel knockouts 32 with a split brush assembly 44. In particular, once a panel knockout 32 has been detached from the top panel 30, the split brush assembly 44 may be readily installed in its place. The split brush assembly 44 includes two separate frame members 46, each separately attachable at a location along an edge of the opening 34 created by removal of a panel knockout 32. Extending from each of the frame members 46 are a quantity of flexible brush bristles 47 that can be deflected to fit snugly around a cable or connector passing through the opening 34, thereby helping to prevent air from leaking through the split brush assembly when cables are routed therethrough. While brush bristles 47 are shown in FIG. 4, it is further contemplated that other resilient, flexible materials may be used to cover an opening 34.

Figure 5:
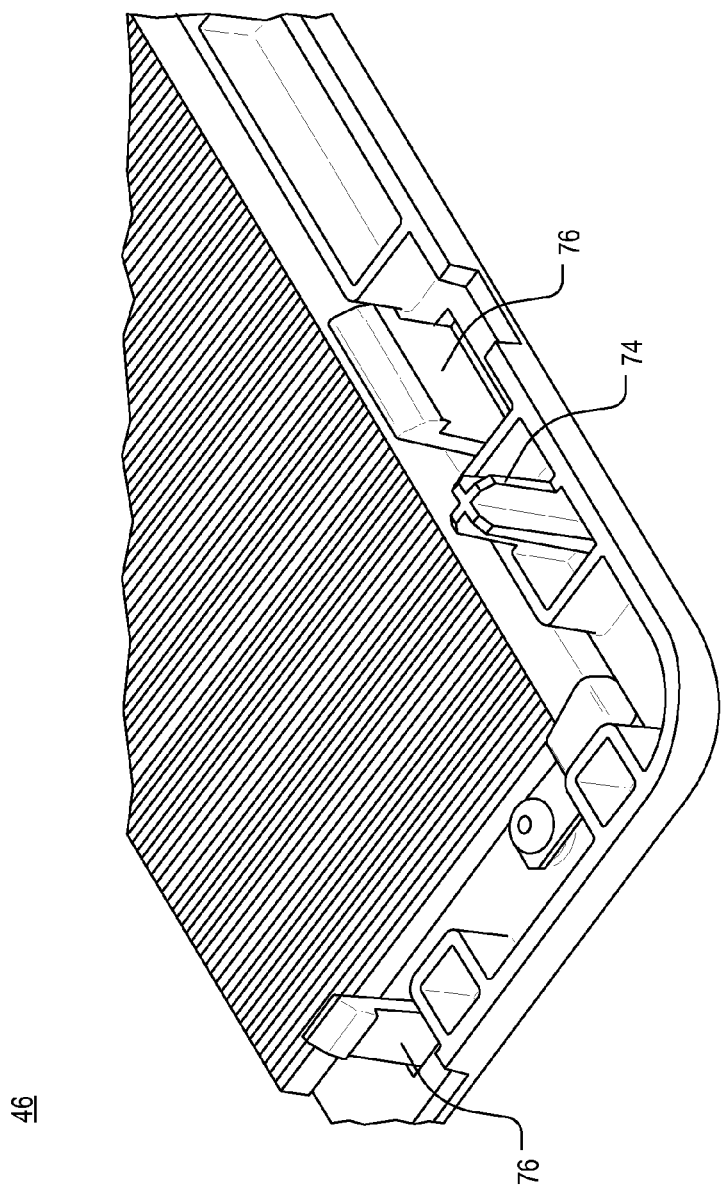
FIG. 5 is an enlarged fragmentary bottom orthogonal view of one of the frame members of the split brush assembly of FIG. 4.

FIG. 5 is an enlarged fragmentary bottom orthogonal view of one of the frame members 46 of the split brush assembly 44 of FIG. 4. The frame members 46 may be attached by any of a variety of different attachment mechanisms. One such mechanism involves snap pins 76 located at an underside of the frame members 46 that correspond with, and snap-fit into, attachment apertures or notches 80 located along the opening 34 created by removal of a panel knockout 32 (as shown in FIG. 3). By snap fitting the frame members 46 separately to the top panel 30, the split brush assembly 44 can be attached to the top panel 30 around a cable or connector that passes through the opening 34 without having to remove the cable or connector itself. Furthermore, the split brush assembly 44 may be installed or removed from the top panel 30 with relative ease without the aid of tools. As further shown in FIG. 5, the frame members 46 of the split brush assembly 44 may include alignment pins 74 at an underside thereof, which matingly correspond with alignment apertures 48 in the top panel 30 (as shown in FIG. 3). The alignment pins 74 permit the split brush assembly 44 to be properly aligned during installation on the top panel 30, thereby facilitating a better snap-fit.

Figure 6:
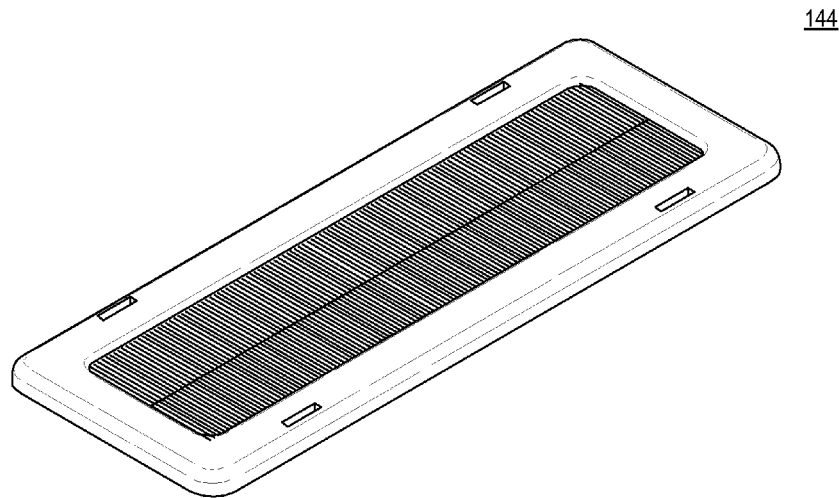
FIG. 6 is a top isometric view of an alternative embodiment of a split brush assembly.

FIG. 6 is a top isometric view of an alternative embodiment of a split brush assembly 144. A panel knockout 32 that has been detached from the top panel 30 may be replaced with a single-piece split brush assembly 144 such as the one shown in FIG. 6. The single-piece split brush assembly 144 has a unitary frame structure, which may be attached to the top panel 30 by snap-fitting without the aid of tools. As with the split brush assembly of FIG. 5, the single-piece split brush assembly 144 of FIG. 6 may also include alignment pins at an underside thereof to facilitate alignment with the top panel 30 during installation.

Figure 7:
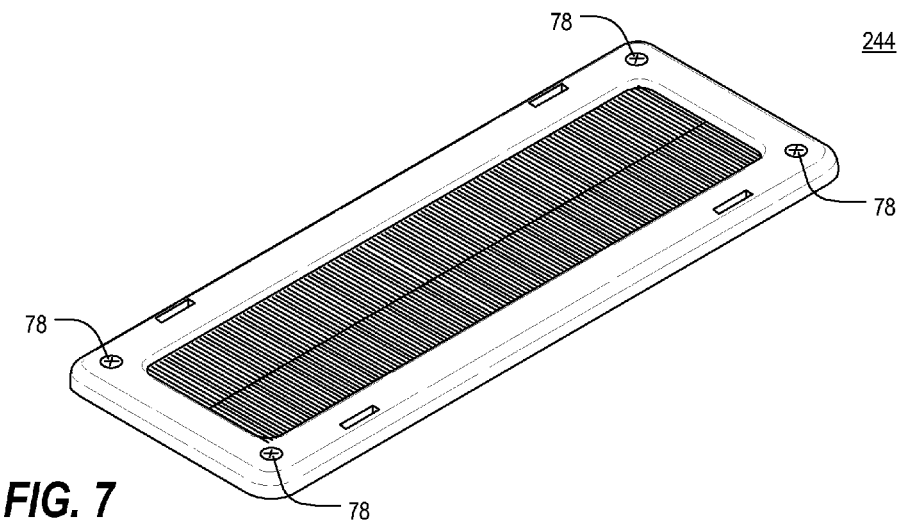
FIG. 7 is a top isometric view of another alternative embodiment of a split brush assembly.

FIG. 7 is a top isometric view of another alternative embodiment of a split brush assembly 244. The split brush assembly 244 of FIG. 7 may be attached to the top panel 30 with separate fasteners 78. A wide range of fasteners 78 may be used to attach the split brush assembly 244 to the top panel 30. In a contemplated embodiment, shown in FIG. 7, the fasteners 78 are threaded screws. Furthermore, while FIG. 7 depicts the use of fasteners 78 in connection with a split brush assembly 244 comprised of a single unitary frame structure, it is contemplated that fasteners 78 may likewise be used in facilitating attachment of a split brush assembly 44 that has separate frame members 46, such as the split brush assembly 44 of FIG. 4.

Figure 8:
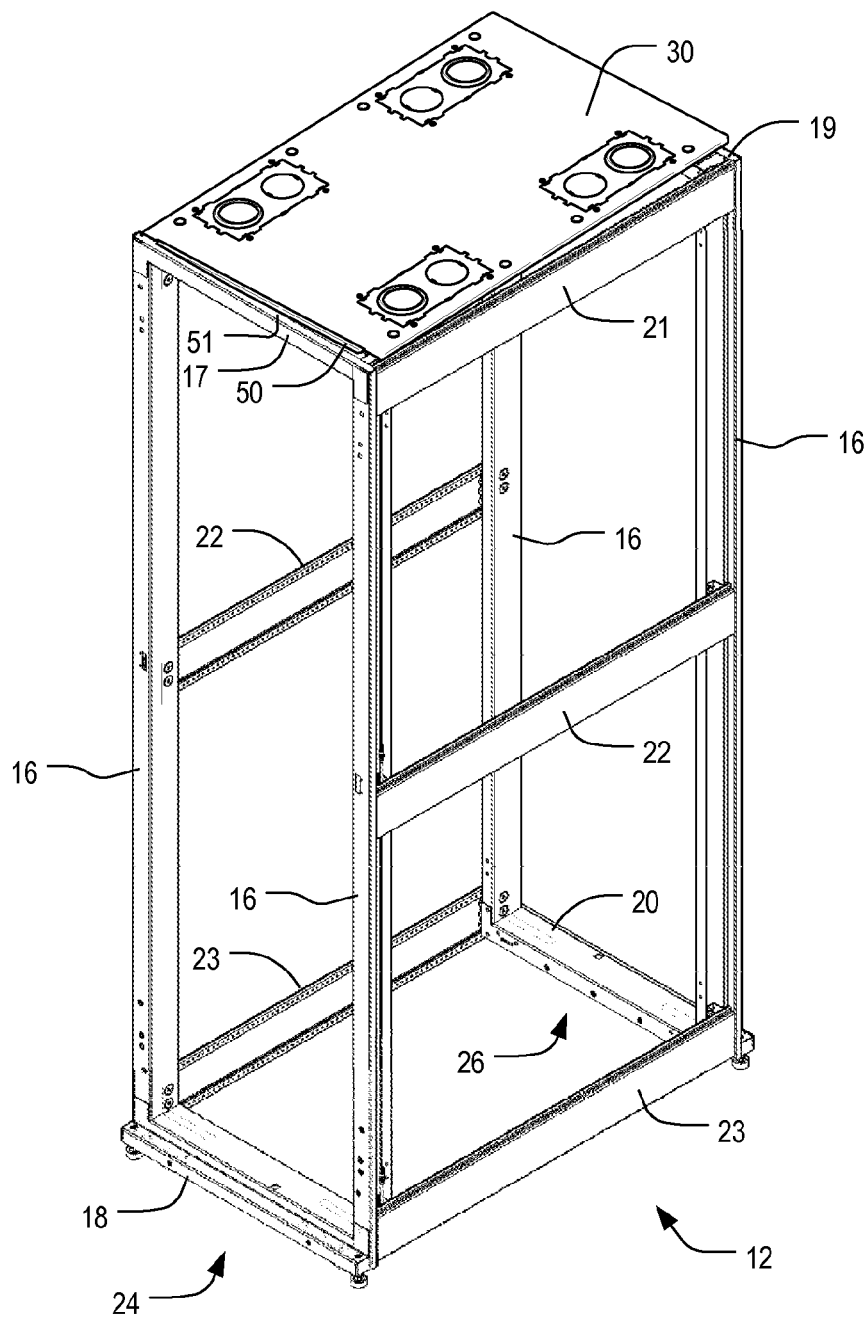
FIG. 8 is a front perspective view of the electronic equipment enclosure of FIG. 1, depicting installation of the top panel.

FIG. 8 is a front perspective view of the electronic equipment enclosure 10 of FIG. 1, depicting installation of the top panel 30. As shown in FIGS. 3, 4 and 8, the top panel 30 further includes an offset edge 50 at one end thereof. The offset edge 50 extends substantially the entire length of the end of the top panel 30 and is positioned slightly below the generally flat surface of the top panel 30 such that it can be slid underneath a retaining flange 51 on one of the upper cross members 17,19. In this regard, the top panel 30 can be oriented such that the offset edge 50 is positioned underneath the retaining flange 51 of either the upper front cross member 17 or the upper rear cross member 19, thereby permitting the top panel 30 to be arranged forward or backward atop the equipment enclosure 10.

Figure 9:
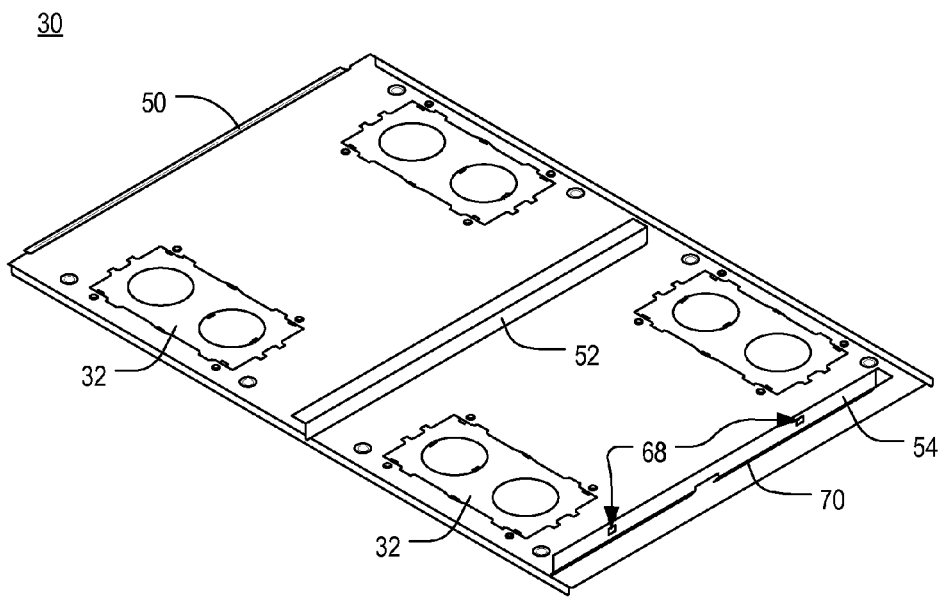
FIG. 9 is a bottom isometric view of the top panel of FIG. 1.

FIG. 9 is a bottom isometric view of the top panel 30 of FIG. 1. As shown in FIG. 9, the top panel 30 further includes a central flange 52 and an end flange 54 positioned along an underside thereof. The central flange 52 is affixed to the underside of the top panel 30 and extends from one side of the top panel 30 to the other and preferably generally equidistant of the ends of the top panel 30. The central flange 52 stiffens the central area of the top panel 30 to provide additional strength and rigidity thereto. The end flange 54 also extends from one side of the top panel 30 to the other and is positioned such that it runs adjacent to an end of the top panel 30. The end flange 54 provides additional strength and rigidity to the top panel 30 and also helps to facilitate tool-less installation of the top panel 30, as will be explained in greater detail below.

Figure 10:
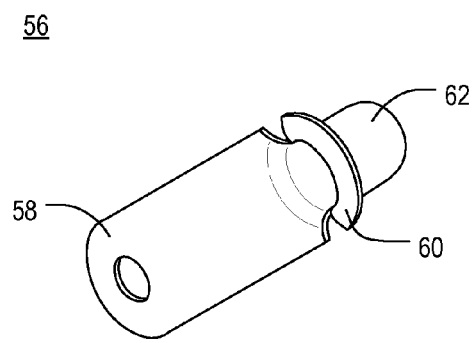
FIG. 10 is an isometric view of one of the spring pins, of the electronic equipment enclosure of FIG. 2, for use in securing the top panel thereon.
Figure 11:
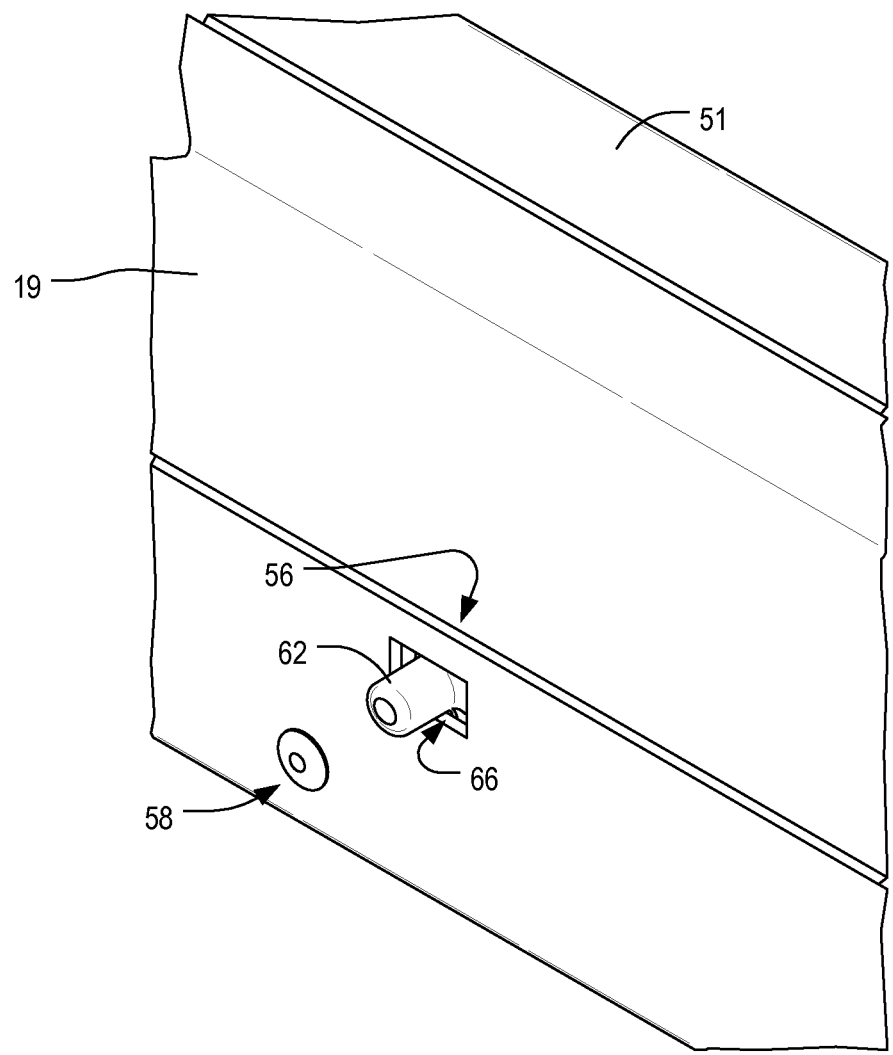
FIG. 11 is an enlarged fragmentary isometric view of a portion of the top rear of the electronic equipment enclosure of FIG. 2 showing a spring pin similar to that of FIG. 7 installed thereon.

FIG. 10 is an enlarged isometric view of one of the spring pins 56, of the electronic equipment enclosure 10 of FIG. 2, for use in securing the top panel 30 thereon, and FIG. 11 is an enlarged fragmentary isometric view of a portion of the top rear of the electronic equipment enclosure 10 of FIG. 2 showing a spring pin 56 similar to that of FIG. 10 installed thereon. As shown in FIG. 10, each spring pin 56 is a cantilever spring that includes an anchor end 58 and a flex end 60 with a protruding knob 62 extending therefrom. When installed, the anchor end 58 is mounted to one side of a mounting structure. The flex end 60 is unmounted and is arranged such that the protruding knob 62 extends through an aperture in the mounting structure. In this regard, the flex end 60 may be deformed by an outside force pressing on the protruding knob 62. Once the outside force is removed, the flex end 60 returns to its original configuration.

Spring pins 56 of the type shown in FIG. 10 are anchored to a portion of the upper front and rear cross members 17,19. As shown in FIG. 11, the anchor end 58 is mounted to one side of a cross member portion 64 of one of the upper front and rear cross members 17,19. The protruding knob 62 of the flex end 60 extends through an aperture 66 in the cross member portion 64 such that the protruding knob 62 protrudes through and beyond the portion 64 at the opposite side thereof. With reference to FIG. 9, the end flange 54 of the top panel 30 includes one or more spring pin openings 68 that correspond with and engage the protruding knobs 62 of the spring pins 56. Furthermore, the end flange 54 of the top panel 30 has an angled or bent outer edge 70 to facilitate initial deflection of the spring pins 56 during top panel installation.

As shown in FIGS. 8-11, the top panel 30 can be installed atop the equipment enclosure 10 without the aid of tools. In a method of installing the top panel 30, the top panel is positioned over the frame structure 12 such that the offset edge 50 is oriented to slide underneath the retaining flange 51 of either of the upper front or rear cross members 17,19 (the front cross member 17 being illustrated). In so doing, the outer edge 70 of the end flange 54 engages the protruding knobs 62 and applies an outside force such that each of the spring pins 56 at the upper front or rear cross member 17,19 is deflected. Once the offset edge 50 is properly aligned underneath the retaining flange 51 of the cross member 17,19 and the top panel 30 is lowered into position atop the frame structure 12, the spring pin openings 68 of the end flange 54 enter into alignment with the apertures 66 of the cross member 17,19. Upon this alignment, the outside force causing the spring pins 56 to deflect is effectively removed and each the spring pin 56 returns to its original configuration. In this state, each protruding knob 62 extends through both the aperture 66 of the upper front or rear cross member 17,19 as well as the corresponding spring pin opening 68 of the end flange 54 of the top panel 30. The top panel 30 is thus secured automatically into a proper position atop the equipment enclosure 10 without the aid of tools. Furthermore, secondary operations, such as the application of separate fasteners to the top panel 30, are not required to secure the top panel 30 into position.

In a contemplated embodiment, depicted in FIGS. 1, 2 and 8, the equipment enclosure 10 includes four spring pins 56. As perhaps best shown in FIG. 2, two such spring pins 56 are mounted on each of the upper front and rear cross members 17,19. When installed, the top panel 30 need only use the spring pins 56 located at one end of the equipment enclosure 10 at a time. In this regard, the top panel 30 is further customizable because the top panel 30 is configured to be fully reversible. The end flange 54 of the top panel 30 can be secured with the spring pins 56 located at either the upper front or rear cross member 17,19.

Figure 12A:
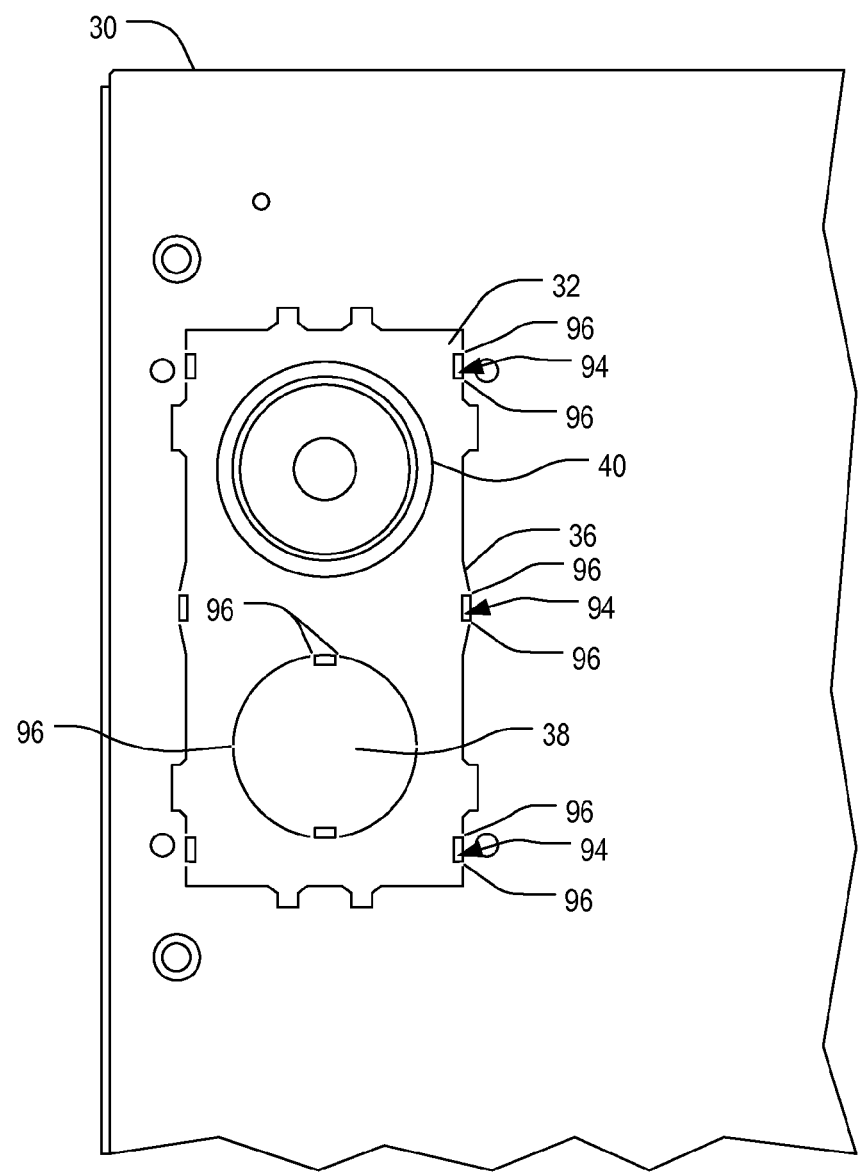
FIG. 12A is an enlarged fragmentary top view of a portion of the top panel of FIG. 1, shown with a panel knockout having curved lateral edges.
Figure 12B:
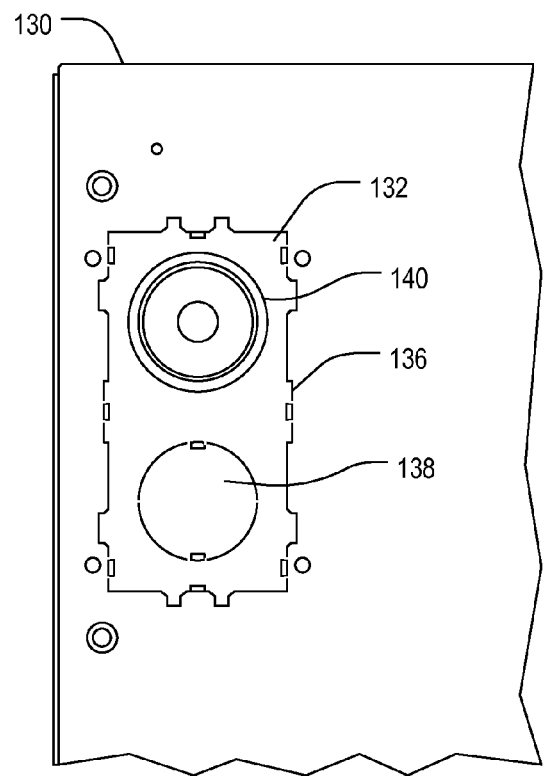
FIG. 12B is an enlarged fragmentary top view of a portion of another top panel in accordance with one or more preferred embodiments of the present invention, shown with a panel knockout having stair-stepped lateral edges.
Figure 12C:
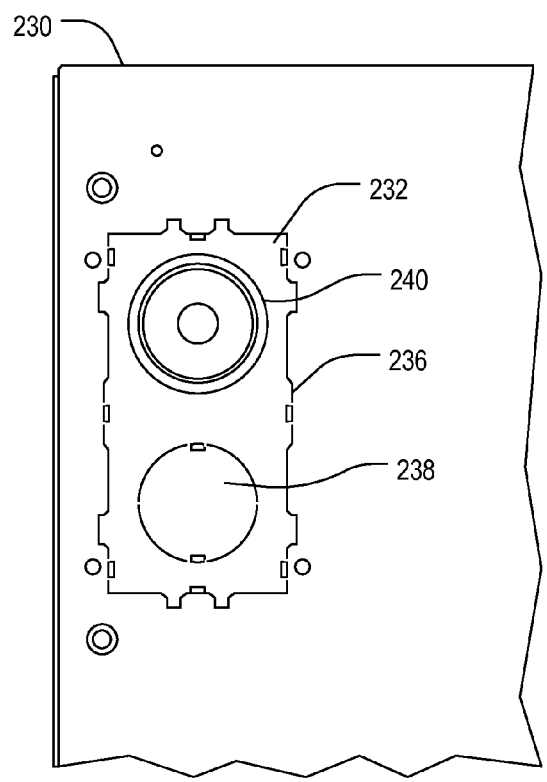
FIG. 12C is an enlarged fragmentary top view of a portion of still another top panel in accordance with one or more preferred embodiments of the present invention, shown with a panel knockout having chamfered lateral edges.

FIG. 12A is an enlarged fragmentary top view of a portion of the top panel 30 of FIG. 1, shown with a panel knockout 32 having curved lateral edges 36. Additionally, FIG. 12B is an enlarged fragmentary top view of a portion of another top panel 130 in accordance with one or more preferred embodiments of the present invention, shown with a panel knockout 132 having stair-stepped lateral edges 136; and FIG. 12C is an enlarged fragmentary top view of a portion of still another top panel 230 in accordance with one or more preferred embodiments of the present invention, shown with a panel knockout 232 having chamfered lateral edges 236. In each configuration, when the panel knockout 32,132,232 is removed, the resultant opening is at least slightly wider along the center. In this regard, each configuration may help accommodate larger connectors and cables. With further reference to FIG. 12A, the top panels 30 may have openings 94 to facilitate the removal of panel knockouts 32 and panel sub-knockouts 38. At either side of openings 94 and spaced along edges of the panel knockouts 32 and panel sub-knockouts 38 are attachment points 96, where the panel knockouts 32 and panel sub-knockouts 38 remain attached to the top panel 30 following the laser-cutting process. In like manner, openings 94 and attachment points 96 may be used in connection with panel knockouts 132,232 and panel sub-knockouts 138,238 of panels 130,230, shown in FIGS. 12B and 12C.

Figure 13:
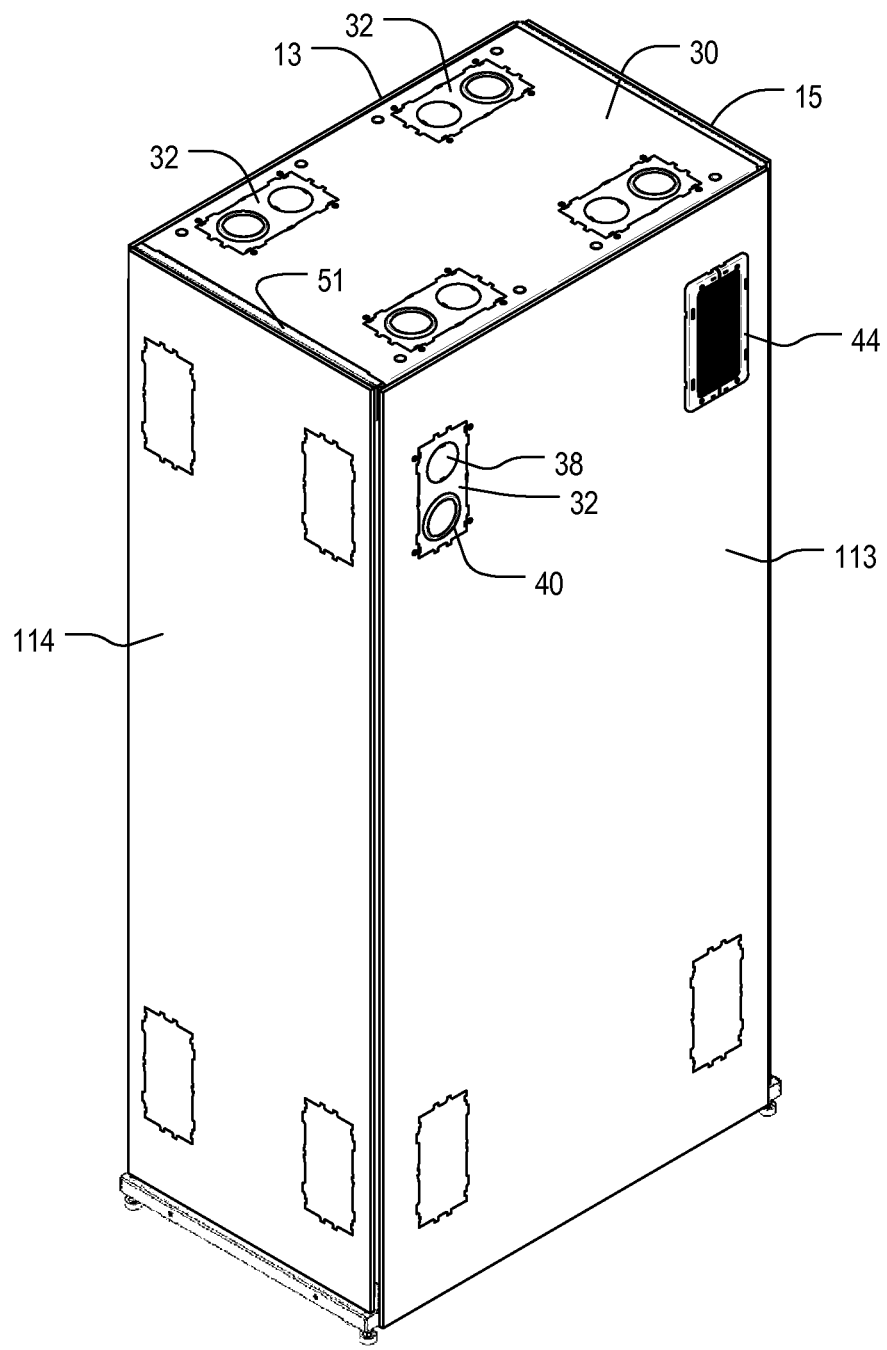
FIG. 13 is a front isometric view of another electronic equipment enclosure with a plurality of cable pass-through panels installed thereon in accordance with one or more preferred embodiments of the present invention.

FIG. 13 is a front isometric view of another electronic equipment enclosure 110 with a plurality of cable pass-through panels 30,113,114 installed thereon in accordance with one or more preferred embodiments of the present invention. As shown in FIG. 13, cable pass-through panels 113 may be configured to attach to the left or right side of the electronic equipment enclosure 110, and cable pass-through panels 114 may be configured to attach to the front of the electronic equipment enclosure 110. Cable pass-through panels may likewise be installed at the rear or bottom of the electronic equipment enclosure 110. As shown in FIG. 13, cable pass-through panels 113,114 may include panel knockouts 32 and panel sub-knockouts 38 as desired in order to facilitate cable pass-through. Furthermore, removed ones of the panel knockouts 32 may be replaced with a split brush assembly 44, and removed ones of the panel sub-knockouts 38 may be replaced with a vent 40.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure comprising:
 (a) a frame structure comprising:
  (i) a pair of front vertical support posts connected together by a plurality of front cross members to define a front frame;
  (ii) a pair of rear vertical support posts connected together by a plurality of rear cross members to define a rear frame; and
  (iii) a plurality of side cross members connecting the front frame to the rear frame;
 (b) a top panel for securement over an opening in the frame structure defined by an upper one of the plurality of front cross members, an upper one of the plurality of rear cross members, and upper ones of the plurality of side cross members, the top panel including:
  (i) one or more panel knockouts arranged therein and being permanently removable therefrom by punching the one or more panel knockouts from the top panel to provide a pass-through opening for a cable;
  (ii) an offset edge at one end of the top panel; and
  (iii) an end flange adjacent an opposite end of the top panel, inset from an edge of the top panel and disposed along an interior-facing side of the top panel, the end flange including an aperture therein; and
 (c) at least one spring pin anchored to at least one of the upper front and rear cross members, the spring pin including a deflectable free end;
 (d) wherein the top panel is adapted to be secured atop the frame structure with the offset edge positioned beneath one of the upper front and rear cross members and the end flange positioned adjacent the other of the upper front and rear cross members such that the deflectable free end of the at least one spring pin extends through the aperture in the end flange, thereby securing the top panel.

2. The electronic equipment enclosure of claim 1, wherein at least one of the one or more panel knockouts includes a central portion having curved lateral edges.

3. The electronic equipment enclosure of claim 1, wherein at least one of the one or more panel knockouts includes a central portion having stair-stepped lateral edges.

4. The electronic equipment enclosure of claim 1, wherein at least one of the one or more panel knockouts includes a central portion having chamfered lateral edges.

5. The electronic equipment enclosure of claim 1, wherein at least one of the one or more panel knockouts includes a vent.

6. The electronic equipment enclosure of claim 1, wherein a split brush assembly is seated in place of a removed one of the one or more panel knockouts.

7. The electronic equipment enclosure of claim 6, wherein the split brush assembly includes alignment pins inserted within apertures in the top panel.

8. The electronic equipment enclosure of claim 1, wherein one or more panel sub-knockouts are arranged in each of the one or more panel knockouts and configured to be removable therefrom to provide a pass-through opening for a cable.

9. An electronic equipment enclosure comprising:
(a) a frame structure comprising:
   (i) a pair of front vertical support posts connected together by a plurality of front cross members to define a front frame;
   (ii) a pair of rear vertical support posts connected together by a plurality of rear cross members to define a rear frame; and
   (iii) a plurality of side cross members connecting the front frame to the rear frame; and
(b) a top panel for securement over an opening in the frame structure defined by an upper one of the plurality of front cross members, an upper one of the plurality of rear cross members, and upper ones of the plurality of side cross members, the top panel including:
   (i) a generally planar sheet composed of a metal-based material, the generally planar sheet including an interior edge that defines an opening, the interior edge including at least one notch disposed therealong;
   (ii) a first panel knockout arranged in the generally planar sheet and configured to be removable therefrom; and
   (iii) a split brush assembly seated in the opening for snugly accommodating a cable passing through the opening, the split brush assembly including at least one snap pin;
   (iv) wherein the opening is formed by removal of a second panel knockout;
   (v) wherein a shape of the interior edge, including the at least one notch, corresponds to a shape of the second panel knockout; and
   (vi) wherein the at least one snap pin is snap fitted into the at least one notch of the interior edge to fasten the split brush assembly to the generally planar sheet.

10. The electronic equipment enclosure of claim 9, wherein the split brush assembly includes alignment pins inserted within apertures in the generally flat sheet.

11. The electronic equipment enclosure of claim 9, wherein the split brush assembly includes at least two separate frame members, each separately attached to the generally planar sheet.

12. The electronic equipment enclosure of claim 9, wherein the split brush assembly includes a unitary structure attached to the generally planar sheet.

* * * * *